United States Patent
Park (10) Patent No.: US 10,923,506 B2
(45) Date of Patent: Feb. 16, 2021

(54) ELECTROLUMINESCENCE DISPLAY DEVICE

(71) Applicant: LG DISPLAY CO., LTD., Seoul (KR)

(72) Inventor: JeongHwan Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 53 days.

(21) Appl. No.: 15/988,701

(22) Filed: May 24, 2018

(65) Prior Publication Data

US 2019/0006390 A1    Jan. 3, 2019

(30) Foreign Application Priority Data

Jun. 30, 2017   (KR) .......................... 10-2017-0083433

(51) Int. Cl.
| | |
|---|---|
| *H01L 27/12* | (2006.01) |
| *H01L 29/417* | (2006.01) |
| *G09G 3/20* | (2006.01) |
| *H01L 29/786* | (2006.01) |
| *H01L 27/32* | (2006.01) |

(52) U.S. Cl.
CPC ............ *H01L 27/124* (2013.01); *G09G 3/20* (2013.01); *H01L 27/1218* (2013.01); *H01L 27/1222* (2013.01); *H01L 27/1225* (2013.01); *H01L 27/1251* (2013.01); *H01L 27/3276* (2013.01); *H01L 29/41733* (2013.01); *H01L 29/7869* (2013.01); *H01L 29/78696* (2013.01); *H01L 27/3262* (2013.01)

(58) Field of Classification Search
CPC ..................... H01L 27/3262; H01L 27/3276
See application file for complete search history.

(56) References Cited

U.S. PATENT DOCUMENTS

| | | | | |
|---|---|---|---|---|
| 2010/0176395 | A1* | 7/2010 | Choi ..................... | H01L 27/12 257/43 |
| 2015/0144905 | A1 | 5/2015 | Kim et al. | |
| 2015/0371589 | A1 | 12/2015 | Kim et al. | |
| 2016/0005872 | A1* | 1/2016 | Kurata ................ | H01L 23/485 257/43 |
| 2016/0315104 | A1* | 10/2016 | Han .................... | H01L 27/1251 |

(Continued)

FOREIGN PATENT DOCUMENTS

| | | | |
|---|---|---|---|
| CN | 103185999 A | * | 7/2013 |
| KR | 10-2015-0028055 A | | 3/2015 |

(Continued)

*Primary Examiner* — Cuong Q Nguyen
*Assistant Examiner* — Peter M Albrecht
(74) *Attorney, Agent, or Firm* — Birch, Stewart, Kolasch & Birch, LLP (57) ABSTRACT

An electroluminescence display device is disclosed, which may use a polysilicon thin film transistor and an oxide thin film transistor together by using a dual line with respect to a plurality of switching transistors arranged on the same line. The electroluminescence display device includes a first active layer; a first gate line arranged on the first active layer and intersecting the first active layer; a second active layer forming a channel different from that of the first active layer, arranged on the first gate line; and a second gate line arranged on the second active layer and intersecting the second active layer. The first gate line and the second gate line are overlapped with each other, and the first gate line and the second gate line supply the same gate signal.

14 Claims, 5 Drawing Sheets

(56) References Cited

U.S. PATENT DOCUMENTS

2016/0343737 A1* 11/2016 Zhang ................. H01L 27/1225
2017/0199411 A1* 7/2017 Kim .................... H01L 27/1255

FOREIGN PATENT DOCUMENTS

| KR | 10-2015-0059478 A | 6/2015 | | |
|----|-------------------|--------|---|---|
| KR | 10-2015-0146117 A | 12/2015 | | |
| WO | WO-2004015673 A1 * | 2/2004 | ........... | G02F 1/1362 |

* cited by examiner

ELECTROLUMINESCENCE DISPLAY DEVICE

CROSS REFERENCE TO RELATED APPLICATION

This application claims the priority benefit of the Korean Patent Application No. 10-2017-0083433 filed on Jun. 30, 2017 in the Korean Patent Office, the disclosure of which is hereby incorporated by reference in its entirety.

BACKGROUND OF THE INVENTION

Field of the Invention

The present invention relates to an electroluminescence display device.

Discussion of the Related Art

Many technologies in the field of display devices for displaying visual information as a video or picture image have been developed in the information age. Among the display devices, an electroluminescence display device displays a picture image by using a light emitting diode that generates light by means of recombination of electrons and holes. The electroluminescence display device has a fast response speed and at the same time may maximize low contrast in accordance with self-emission, whereby the electroluminescence display device has received attention as a next generation display.

The electroluminescence display device comprises pixels provided on a display area for displaying a picture image. Each of the pixels has a plurality of thin film transistors (TFTs). Examples of the thin film transistor include a low temperature polycrystalline silicon (LTPS), an amorphous silicon (A-Si), and an oxide based on a material for forming a channel of an active layer.

Since electron mobility physical properties are varied depending on the types of the thin film transistor, there is a difference in a current size of a turn-on state or a voltage size of a turn-off state during switching. That is, there is a difference in view of pixel driving depending on the types of the thin film transistor. Therefore, a pixel structure is preferable, in which a low temperature polycrystalline silicon thin film transistor and an oxide thin film transistor are used together in one pixel depending on a position and role of the thin film transistor. However, the conventional pixel structure has a problem in that transistors to which the same gate signal is input can be manufactured as the same type only.

SUMMARY OF THE INVENTION

Accordingly, the present invention is directed to an electroluminescence display device that substantially obviates one or more problems due to limitations and disadvantages of the related art.

An advantage of the present invention is to provide an electroluminescence display device in which a low temperature polysilicon thin film transistor and an oxide thin film transistor are used together with respect to a plurality of switching transistors to which the same input signal is input. That is, the present invention is to provide a display device that may use a low temperature polysilicon thin film transistor and an oxide thin film transistor together by using a dual line with respect to a plurality of switching transistors arranged on the same line.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an electroluminescence display device according to an aspect of the present invention comprises a first active layer; a first gate line arranged on the first active layer and intersecting the first active layer; a second active layer forming a channel different from that of the first active layer, arranged on the first gate line; and a second gate line arranged on the second active layer and intersecting the second active layer. The first gate line and the second gate line are overlapped with each other, and the first gate line and the second gate line supply the same gate signal.

An electroluminescence display device according to another aspect of the present invention comprises a first active layer; a first gate line arranged on the first active layer to intersect the first active layer; a second active layer forming a channel different from that of the first active layer, arranged on the first gate line; and a second gate line arranged on the second active layer to intersect the second active layer. The second gate line is superimposed on the first gate line, and is separated from the first gate line by an insulating layer.

An electroluminescence display device according to another aspect of the present invention comprises a first active layer; a first gate line arranged on the first active layer to intersect the first active layer; a second active layer forming a channel different from that of the first active layer, arranged on the first gate line; and a second gate line arranged on the second active layer to intersect the second active layer. The first gate line and the second gate line supply the same gate signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another element. Therefore, a first element could be termed a second element, and, similarly, a second element could be termed a first element, without departing from the scope of the present invention.

"First horizontal-axis direction", "second horizontal-axis direction" and "vertical-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the example embodiments of an electroluminescence display device according to the present invention will be described in detail with reference to the accompanying drawings.

Figure 1:
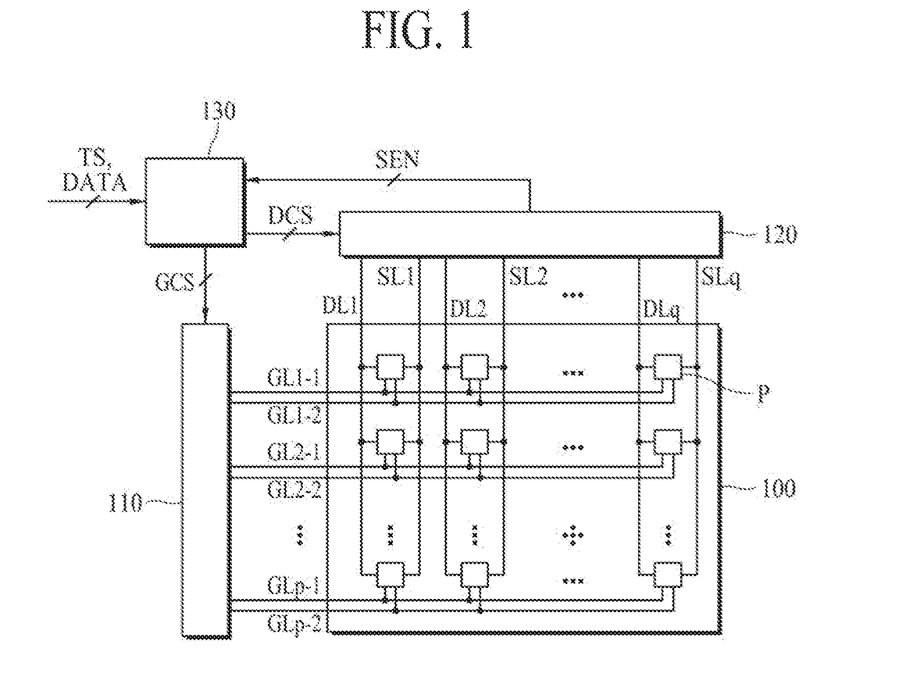
FIG. 1 is a conceptual block view illustrating an electroluminescence display device according to the present invention.
Figure 2:
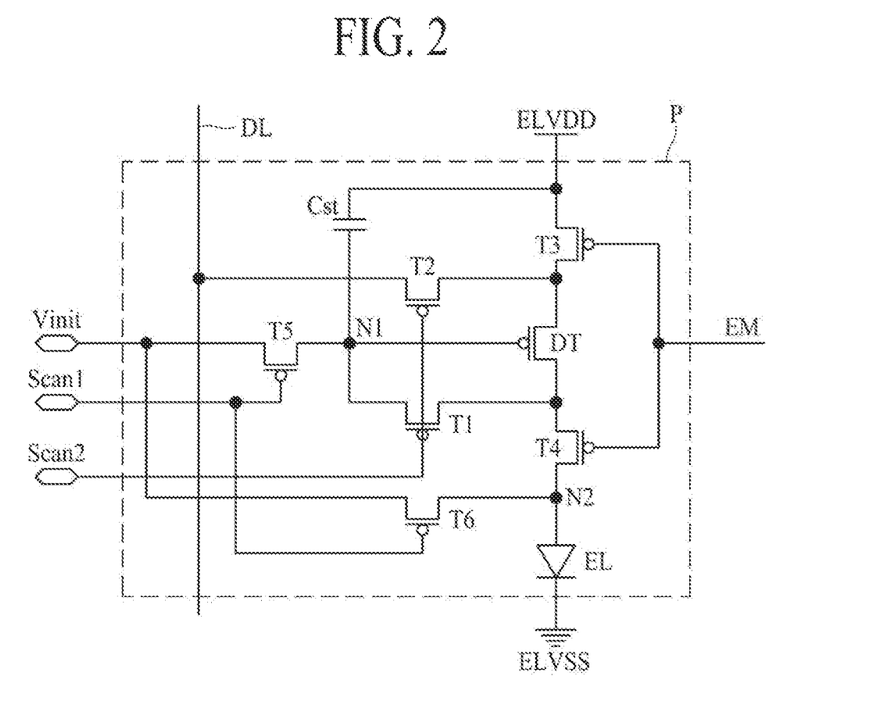
FIG. 2 is an internal circuit view illustrating a pixel according to one embodiment of the present invention.

FIG. 1 is a conceptual block view illustrating an electroluminescence display device according to the present invention, and FIG. 2 is an internal circuit view illustrating a pixel P according to one embodiment of the present invention;

Referring to FIGS. 1 and 2, the electroluminescence display device according to the present invention comprises a display panel 100, a gate driver 110, a data driver 120, and a timing controller (T-CON) 130.

The display panel 110 includes a display area and a non-display area provided near the display area. The display area is provided with pixels P to display an image. The non-display area is an area for forming an edge of the display panel 100 and protecting the display area from external impact. The display panel 100 is provided with gate lines GL1-1 to GLp-2 (p is a positive integer of 2 or more), data lines DL1 to DLq (q is a positive integer of 2 or more) and sensing lines SL1 to SLq. The data lines DL1 to DLq and the sensing lines SL1 to SLq may cross the gate lines GL1-1 to GLp-2. The data lines DL1 to DLq may be parallel with the sensing lines SL1 to SLq. The display panel 100 may include a lower substrate provided with pixels P and an upper substrate for performing an encapsulation function for protecting the pixels from external foreign materials.

Each of the pixels P may be connected to any one of the gate lines GL1-1 to GLp-2, any one of the data lines DL1 to DLq, and any one of the sensing lines SL1 to SLq. As shown in FIG. 2, each of the pixels P according to one embodiment of the present invention includes a driving transistor DT, a light emitting diode EL, a storage capacitor Cst, and first to sixth transistors T1 to T6. In this instance, a pair of the gate lines GL1-1 and GL1-2 are connected to one pixel. A pair of the gate lines GL1-1 and GL1-2 respectively supply a pair of scan signals Scan1 and Scan2.

The driving transistor DT includes a gate electrode, a source electrode and a drain electrode. The gate electrode of the driving transistor DT is connected to one side electrode of the capacitor Cst, a drain electrode of the first transistor T1, and a first node N1 to which a source electrode of the fifth transistor T5 is connected. The source electrode of the driving transistor DT is connected with a drain electrode of the third transistor T3 of which source electrode is supplied with a pixel driving power source ELVDD. The drain electrode of the driving transistor DT is connected with a source electrode of the fourth transistor T4.

If a voltage greater than a threshold voltage is supplied to the gate electrode of the driving transistor DT, the driving transistor DT is turned on. If the driving transistor DT is implemented as a P type MOSFET, the driving transistor DT which is turned on flows a driving current from the source electrode to the drain electrode.

The light emitting diode EL includes an anode electrode and a cathode electrode. The light emitting diode EL flows a driving current from the anode electrode to the cathode electrode. The anode electrode of the light emitting diode EL is connected to a second node N2 to which a drain electrode of the fourth transistor T is connected. The cathode electrode of the light emitting diode EL is connected to a ground line in which a low potential power voltage ELVSS is formed. The light emitting diode EL emits light with brightness corresponding to the driving current flowing from the driving transistor DT.

The storage capacitor Cst has electrodes at both sides. One side electrode of the storage capacitor Cst is connected to the first node N1. The other side electrode of the storage capacitor Cst is connected to a pixel driving power source ELVDD line.

The storage capacitor Cst stores a differential voltage between the pixel driving power source ELVDD and the first node N1 if the fifth transistor T5 connected to the first node N1 is turned on. The storage capacitor Cst maintains the differential voltage stored in the first node N1 if the fifth transistor T5 is turned off. Also, the storage capacitor Cst may control driving of the driving transistor DT by using the voltage which is stored and maintained.

The gate electrode of the first transistor T1 is supplied with the second scan signal Scan2. The source electrode of the first transistor T1 is connected with the drain electrode of the driving transistor DT. The drain electrode of the first transistor T1 is connected with the first node N1. The first transistor T1 is turned on by the second scan signal Scan2 to increase the voltage of the first node N1 to reach a sum Vdata+Vtp of a data voltage Vdata and a threshold voltage Vtp of the driving transistor DT.

The gate electrode of the second transistor T2 is supplied with the second scan signal Scan2. The source electrode of the second transistor T2 is connected with the data line DL and thus supplied with the data voltage Vdata. The drain electrode of the second transistor T2 is connected with the source electrode of the driving transistor DT. The second transistor T2 is turned on by the second scan signal Scan2 to supply the data voltage to the source electrode of the driving transistor DT.

The first transistor T1 and the second transistor T2 are supplied with the same gate input signal, that is, the second scan signal Scan2. Therefore, according to the present invention, a line to which the second scan signal Scan 2 is supplied is designed as a dual line, whereby a low temperature polysilicon thin film transistor and an oxide thin film transistor may be used together as the first transistor T1 and the second transistor T2.

The gate electrode of the third transistor T3 is supplied with a light emitting control signal EM. The source electrode of the third transistor T3 is supplied with the pixel driving power source ELVDD. The drain electrode of the third transistor T3 is connected with the source electrode of the driving transistor DT. The third transistor T3 is turned on by the light emitting control signal EM to supply the pixel driving power source ELVDD to the driving transistor DT, whereby the driving transistor DT allows the driving current to flow.

The gate electrode of the fourth transistor T4 is supplied with the light emitting control signal EM. The source electrode of the fourth transistor T4 is connected with the drain electrode of the driving transistor DT. The drain electrode of the fourth transistor T4 is connected with a second node N2. The fourth transistor T4 is turned on by the light emitting control signal EM to allow the driving current to flow to the light emitting diode EL, whereby the EL emits light.

The gate electrodes of the third transistor T3 and the fourth transistor T4 are supplied with the same input signal, that is, the light emitting control signal EM. Therefore, according to the present invention, a line to which the light emitting control signal EM is supplied is designed as a dual line, whereby a low temperature polysilicon thin film transistor and an oxide thin film transistor may be used together as the third transistor T3 and the fourth transistor T4.

The gate electrode of the fifth transistor T5 is supplied with the first scan signal Scan1. The source electrode of the fifth transistor T5 is supplied with an initialization voltage Vinit. The drain electrode of the fifth transistor T5 is connected with the first node N1. The fifth transistor T5 is turned on by the first scan signal Scan1 to initialize the voltage of the first node N1 to an initialization voltage Vinit.

The gate electrode of the sixth transistor T6 is supplied with the first scan signal Scan1. The source electrode of the sixth transistor T6 is supplied with an initialization voltage Vinit. The drain electrode of the sixth transistor T6 is connected with the second node N2. The sixth transistor T6 is turned on by the first scan signal Scan1 to initialize the voltage of the second node N2 to the initialization voltage Vinit.

The fifth transistor T5 and the sixth transistor T6 are supplied with the same input signal, that is, the first scan signal Scan1. Therefore, according to the present invention, a line to which the first scan signal Scan1 is supplied is designed as a dual line, whereby a low temperature polysilicon thin film transistor and an oxide thin film transistor may be used together as the fifth transistor T5 and the sixth transistor T6.

The gate driver 110 receives a gate driver control signal GCS from the timing controller 130, and generates gate signals in accordance with the gate driver control signal GCS and supplies the generated gate signals to the gate lines GL1 to GLp.

The data driver 120 receives a data driver control signal DCS from the timing controller 130, and generates data voltages in accordance with the data driver control signal DCS and supplies the generated data voltages to the data lines DL1 to DLq. Also, the data driver 120 generates sensing data SEN by sensing a voltage and current properties of each of the pixels P and supplies the generated sensing data SEN to the timing controller 130.

The timing controller 130 receives timing signals TS for controlling display timing of an image and digital video data DATA, which include information per color for realizing an image, from the external device. The timing signals TS and the digital video data DATA are input to an input terminal of the timing controller 130 by a protocol which is set. Also, the timing controller 130 receives sensing data SEN according to voltage and current properties of each of the pixels P from the data driver 120.

The timing signals TS include a vertical synchronization signal Vsync, a horizontal synchronization signal Hsync, a data enable signal DE, and a dot clock DLCK. The timing controller 130 compensates for the digital video data DATA on the basis of the sensing data SEN.

The timing controller 130 generates driver control signals for controlling an operation timing of the gate driver 110, the data driver 120, a scan driver and a sensing driver. The driver control signals include a gate driver control signal GCS for controlling an operation timing of the gate driver 110, a data driver control signal DCS for controlling an operation timing of the data driver 120, a scan driver control signal for controlling an operation timing of the scan driver, and a sensing driver control signal for controlling an operation timing of the sensing driver.

The timing controller 130 operates the data driver 120, the scan driver and the sensing driver in any one of a display mode and a sensing mode in accordance with a mode signal. The display mode is a mode that the pixels P of the display panel 100 display an image, and the sensing mode is a mode for sensing a current of the driving transistor DT of each of the pixels P. If waveforms of the scan signal and the sensing signal supplied to each of the pixels P are changed in each of the display mode and the sensing mode, the data driver control signal DCS, the scan driver control signal and the sensing driver control signal may also be changed in each of the display mode and the sensing mode. Therefore, the timing controller 130 generates the data driver control signal DCS, the scan driver control signal and the sensing driver control signal to correspond to the corresponding mode depending on the display mode or the sensing mode.

The timing controller 130 outputs the gate driver control signal GCS to the gate driver 110. The timing controller 130 outputs compensation digital video data and the data driver control signal DCS to the data driver 120. The timing controller 130 outputs the scan driver control signal to the scan driver. The timing controller 130 outputs the sensing driver control signal to the sensing driver.

Also, the timing controller 130 generates a mode signal for driving the corresponding mode depending on the data driver 120, the scan driver and the sensing driver being driven in the display mode or the sensing mode The timing controller 130 operates the data driver 120, the scan driver and the sensing driver in any one of the display mode and the sensing mode in accordance with the mode signal.

Figure 3:
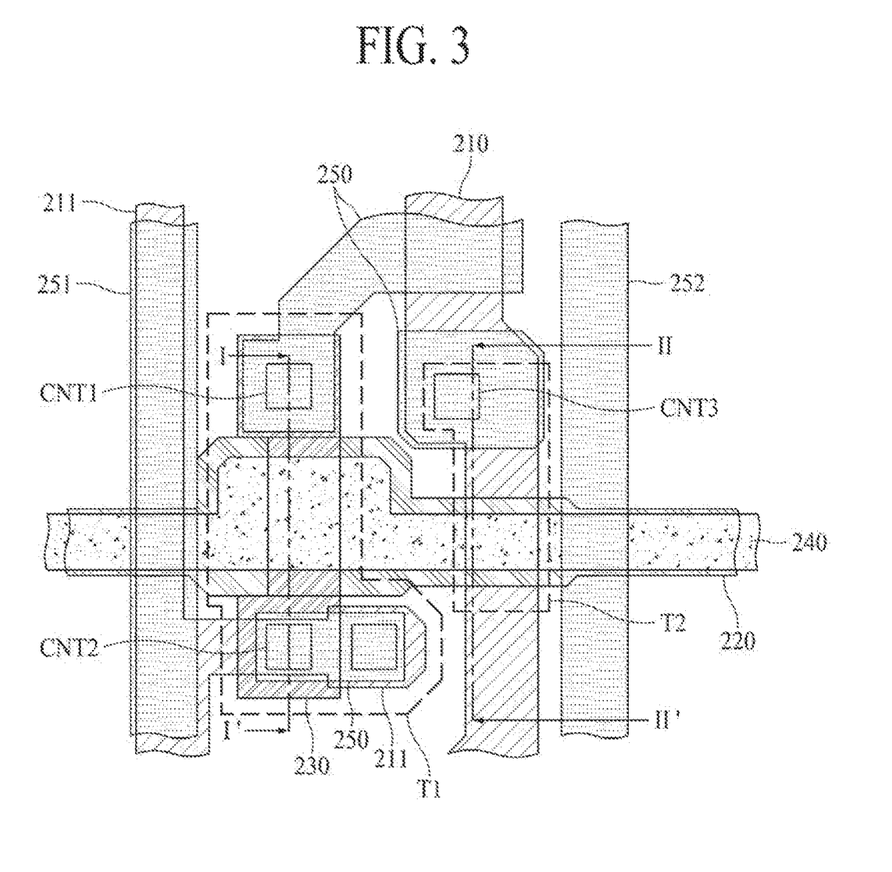
FIG. 3 is a detailed plane view illustrating a compensation circuit portion of an electroluminescence display device according to one embodiment of the present invention.

FIG. 3 is a detailed plane view illustrating a compensation circuit portion of an electroluminescence display device according to one embodiment of the present invention.

The electroluminescence display device according to one embodiment of the present invention includes a first active layer 210, a first data line 211, a first gate line 220, a second active layer 230, a second gate line 240, a source/drain layer 250, a second data line 251, and a power line 252.

The first active layer 210 forms a semiconductor layer of some of switching transistors and a driving transistor for performing compensation among transistors constituting a compensation circuit. The first active layer 210 is made of a first semiconductor material. In FIG. 3, the first active layer 210 including the first semiconductor material forms a semiconductor layer of a second switching transistor, and the second active layer 230 including a second semiconductor material different from the first semiconductor material of the first active layer 210 forms a semiconductor layer of a first switching transistor.

The first data line 211 is provided in an area where the second data line 251 for supplying a data voltage prior to compensation is formed. The first semiconductor material constituting the first active layer 210 is made conductive to form the first data line 211. The first data line 211 formed by the first semiconductor material being made conductive is connected with the second data line 251 to which the data voltage is supplied. The first data line 211 connected with the second data line 251 supplies the data voltage to the first switching transistor. The first data line 211 is formed in a non-light emission area of each pixel, whereby an opening ratio of the pixels is prevented from being deteriorated.

In this instance, it is preferable that the first active layer 210 is formed of a material that less affects driving even in an instance of a relatively low response speed and satisfies voltage-current properties. Moreover, since a plurality of switching transistors are used in the pixel P according to the present invention, the first active layer 210 that forms the semiconductor layer of the switching transistors should be easy to realize stability and uniformity of the switching transistors. That is, it is preferable that the first active layer 210 is formed of a material that may ensure stability and uniformity of the switching transistors.

For example, the first active layer 210 may be formed as a low temperature polysilicon (LTPS) channel. The first active layer 210 may include a low temperature polysilicon (LTPS). Since a polysilicon material has low energy power consumption and excellent reliability due to high mobility (100 $cm^2$/Vs or more), the polysilicon material may be applied to a gate driver for a driving element for driving thin film transistors for a display element and/or a multiplexer (MUX), and may be applied to an active layer of a driving thin film transistor in a display device.

The first gate line 220 and the second gate line 240 supply the same gate signal to the first and second switching transistors. The first switching transistor according to the present invention has a dual gate structure in which a gate signal is supplied from two gate lines. The first and second gate lines 220 and 240 are arranged to cross the first and second active layers 210 and 230. The first and second gate lines 220 and 240 are arranged in a direction vertical to the first and second active layers 210 and 230 while cross the first and second active layers 210 and 230 arranged in parallel with the first data line 211. The second gate line 240 is arranged on the second active layer 230 while crossing the second active layer 230. An insulating layer is formed between the second gate line 240 and the second active layer 230. The second active layer 230 forms a semiconductor layer of the first switching transistor among the switching transistors constituting the compensation circuit. The second active layer 230 is formed in parallel with the data line. Also, the second active layer 230 is arranged to partially overlap the first data line 211.

According to FIG. 3, the second active layer 230 forms the semiconductor layer of the first switching transistor. The second active layer 230 is suitable for a switching thin film transistor, which maintains a short on-time and a long off-time, among the plurality of transistors.

For example, the second active layer 230 may be formed as an oxide channel. The oxide channel has excellent response speed and voltage-current properties. Since the oxide semiconductor material has a band gap greater than that of a silicon material, electrons fail to pass through the band gap at an off state, whereby an off-current is low. Therefore, a thin film transistor that includes an active layer made of an oxide semiconductor is suitable for a switching thin film transistor that maintains a short on-time and a long off-time. Also, since an off-current is low, a size of a sub-capacity may be reduced, whereby the thin film transistor is suitable for a high resolution display device.

A compensation circuit of the electroluminescence display device according to one embodiment of the present invention may be designed using a channel optimized for each transistor if two types of active layers are arranged using two different channels having their respective properties different from each other by reflecting properties per channel.

In the present invention, the first gate line 220 and the second gate line 240 are overlapped with each other or are superimposed. If the first gate line 220 and the second gate line 240 are not overlapped with each other or are not superimposed, a space where the first gate line 220 will be provided and a space where the second gate line 240 will be provided within one pixel of the electroluminescence display device will be required. Also, a distance between the switching transistor connected with the first gate line 220 and the switching transistor connected with the second gate line 240 is increased, whereby a problem occurs in that an area where the switching transistors are provided is increased. Therefore, in the present invention, the first gate line 220 and the second gate line 240 are overlapped with each other, whereby the space where the gate lines are provided within one pixel and the distance between the first and second switching transistors may be reduced. As a result, an area per one pixel may be reduced. In embodiments of the present invention, reference to superimposed may refer to a complete overlap of the first gate line 220 and the second gate line 240 at a certain area or an interval.

However, if respective gate signals of different timings are supplied to the first gate line 220 and the second gate line 240, interference between signals occurs, whereby gate signals of exact timing are not supplied. Therefore, the first gate line 220 and the second gate line 240 of the electroluminescence display device according to the present invention supply the same gate signal. Therefore, the same pulse may be supplied through the first gate line 220 and the second gate line 240 at the same timing.

The source/drain layer 250 is arranged in an area where source and drain electrodes of the first and second switching transistors are formed. The source/drain layer 250 is connected with the second active layer 230 through first and second contact holes CNT1 and CNT2 in the first switching transistor T1. The source/drain layer 250 is connected with the first active layer 210 through a third contact hole CNT3 in the second switching transistor T2. The source/drain layer 250 formed on the first and third contact hole CNT1 and CNT3 is a single layer. Therefore, the source/drain layer 250 may connect the first active layer 210 with the second active layer 230 through the first and third contact holes CNT1 and CNT3.

The second data line 251 is arranged to partially overlap the first data line 211. The second data line 251 is formed of the same metal material as that of the source/drain layer 250. The second data line 251 supplies a data voltage, which has been compensated, to pixels in one pixel row at one time.

The power line 252 is arranged to pass through an edge area of each pixel. In FIG. 3, the power line 252 is arranged to pass through a right edge area of each pixel. The power line 252 is formed of the same metal material as that of the source/drain layer 250 and the second data line 251. The power line 252 supplies the power voltage to the pixels in one pixel row at one time.

Figure 4:
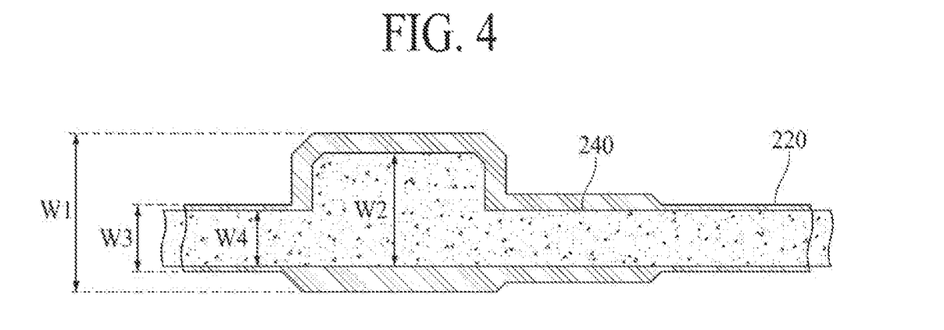
FIG. 4 is a detailed plane view illustrating first and second gate lines of the present invention.

FIG. 4 is a detailed plane view illustrating first and second gate lines 220 and 240 of the present invention.

The first gate line 220 of the present invention has a first width W1 and a third width W3 smaller than the first width W1. The first width W1 is located in an area where the channel of the first switching transistor is formed. In other words, in the area where the first gate line 220 overlaps the second active layer 230, the width of the first gate line 220 is the first width W1. The second gate line 240 of the present invention has a second width W2 and a fourth width W4 smaller than the second width W2. The second width W2 is located in the area where the channel of the first switching transistor is formed. In other words, in the area where the second gate line 240 overlaps the second active layer 230, the width of the second gate line 240 is the second width W2.

In the area where the channel of the first switching transistor of the present invention is formed, the first width W1 of the first gate line 220 may be formed to be greater than the second width W2 of the second gate line 240. This is to use the first gate line 220 as a light-shielding layer for preventing the second active layer 230 from being made conductive by light in the area where the channel of the first switching transistor is formed. Therefore, in the present invention, since the first gate line 220 performs as the role of the light-shielding layer while performing the role of the gate line, a separate light-shielding layer is not required. Therefore, the electroluminescence display device of which thickness is reduced and manufacturing process and manufacturing cost are reduced may be provided.

Additionally, in the area where the channel of the second switching transistor of the present invention is formed, the width of the first gate line 220 may be formed to be greater than the width of the second gate line 240. In other words, in the area where the first gate line 220 and the second gate line 240 are overlapped with the first active layer 210, the width of the first gate line 220 may be formed to be greater than the width of the second gate line 240. This is to use the first gate line 220 as a light-shielding layer for preventing the first active layer 210 from being made conductive by light in the area where the channel of the second switching transistor is formed. Therefore, in the present invention, since the first gate line 220 performs as the role of the light-shielding layer while performing the role of the gate line, a separate light-shielding layer is not required. Therefore, the electroluminescence display device of which thickness is reduced and manufacturing process and manufacturing cost are reduced may be provided.

In the example of FIG. 4, the third width W3 is wider than the fourth width W4. However, the present invention is not limited to the example of FIG. 4, and the fourth width W4 may be wider than or equal to the third width W3 in accordance with the need of design. Although various designs are available in accordance with the need of design, the third width W3 should be wider than the fourth width W4 in the area where the first and second gate lines 220 and 240 are overlapped with the first active layer. In other words, in the area where the channel of the second switching transistor is formed, the third width W3 should be wider than the fourth width W4. In the other areas, the third width W3 may be formed selectively to be greater than, smaller than or equal to the fourth width W4 in accordance with the need of design. Also, an area or a size of each of the first transistor T1 and the second transistor T2 may be different. For example, at least one of the area and the size of the first transistor T1 may be greater than at least one of the area and the size of the second transistor T2.

Figure 5:
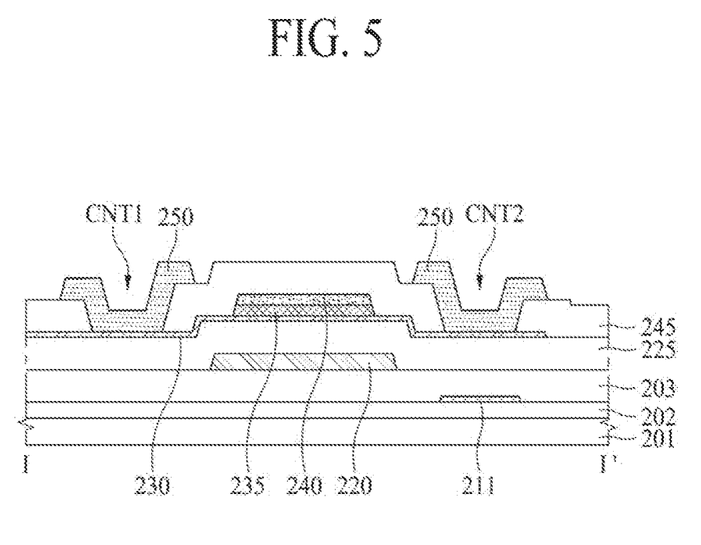
FIG. 5 is a cross-sectional view taken along line I-I' of FIG. 3.

FIG. 5 is a cross-sectional view taken along line I-I' of FIG. 3. As shown in FIG. 5, the electroluminescence display device according to one embodiment of the present invention has a polyimide layer 201, a buffer layer 202, a first gate insulating film 203, a first data line 211, a first gate line 220, a first interlayer insulating film 225, a second active layer 230, a second gate insulating film 235, a second gate line 240, a second interlayer insulating film 245, and a source/drain layer 250.

The polyimide layer 201 serves to provide a bending function to the electroluminescence display device. The polyimide layer 201 is arranged at the outmost on a rear surface of the electroluminescence display device, and is made of polyimide having solubility. Therefore, the electroluminescence display device according to the present invention may be applied to a flexible display. Also, the electroluminescence display device according to the present invention may be bent appropriately with respect to external impact, whereby the electroluminescence display device may be prevented from being broken or damaged.

The buffer layer 202 is arranged on the polyimide layer 201 on the rear surface of the electroluminescence display device. The buffer layer 202 prevents foreign materials from being permeated into the rear surface of the electroluminescence display device. Also, the buffer layer 202 serves to absorb impact transferred from the outside of the electroluminescence display device.

The first data line 211 is arranged on the buffer layer 202. The first data line 211 may be formed by the first semiconductor material being made conductive, and which is the same material as that of the first active layer 210 of the second switching transistor. Since the function and role of the first data line 211 are the same as those described in FIG. 3, their detailed description will be omitted.

The first gate insulating film 203 is arranged on the buffer layer 202 and the first active layer 210. The first gate insulating film 203 blocks electric connection with another conductive layer arranged on the first active layer 210.

The first gate line 220 is arranged on the first gate insulating film 203. Since the function and role of the first gate line 220 are the same as those described in FIG. 3, their detailed description will be omitted.

The first interlayer insulating film 225 is arranged on the first gate insulating film 203 and the first gate line 220. The first interlayer insulating film 225 blocks electric connection between the first gate line 220 and a layer at an upper portion.

The second active layer 230 is arranged on the first interlayer insulating film 225. Since the function and role of the second active layer 230 are the same as those described in FIG. 3, their detailed description will be omitted.

The second gate insulating film 235 is arranged on the second active layer 230. The second gate insulating film 235 is provided on the area where the second gate line 240 is arranged on the second active layer. The second gate insulating film 235 electrically insulates the second active layer 230 from the second gate line 240.

The second gate line 240 is arranged on the second gate insulating film 235. Since the function and role of the second gate line 240 are the same as those described in FIG. 3, their detailed description will be omitted.

The second interlayer insulating film 245 covers the second active layer 230 and the second gate line 240. The second interlayer insulating film 245 allows the second active layer 230 and the second gate line 240 not to be electrically connected with conductive layers at the upper portion.

The source/drain layer 250 is arranged on the second active layer 230 and the second interlayer insulating film 245. In more detail, the source/drain layer 250 is arranged so as not to overlap the second gate line 240. The source/drain layer 250 is arranged in the area where first and second electrodes, which may be the source electrode or the drain electrode of the first switching transistor, are formed on the second active layer 230. If the first electrode is the source electrode, the second electrode becomes the drain electrode. Also, if the first electrode is the drain electrode, the second electrode becomes the source electrode.

The source/drain layer 250 arranged in the first electrode of the first switching transistor is arranged to be spaced apart from the source/drain layer 250 arranged in the second electrode of the first switching transistor. The source/drain layer 250 arranged in the second electrode of the first switching transistor is connected with the second active layer 230 through the second contact hole CNT2 formed in the second gate insulating film 245. The source/drain layer 250 is connected with the second active layer 230 through the second contact hole CNT2 to form the second electrode. The source/drain layer 250 arranged in the second electrode of the first switching transistor maintains the state that it is not connected with the source/drain layer 250 formed in the other area, and is provided in the form of an island.

The source/drain layer 250 arranged in the first electrode of the first switching transistor is connected with the second active layer 230 through the first contact hole CNT1 formed in the second gate insulating film 245. The source/drain layer 250 is connected with the second active layer 230 through the first contact hole CNT1 to form the first electrode.

In the related art, all switching transistors as well as the driving transistor are formed in a single body using the first active layer including low temperature polysilicon (LPTS). Therefore, since all switching transistors are formed using the active layer having the same channel as that of the active layer of the driving transistor, there is limitation in improving response speed and voltage-current properties. Even in an instance that two active layers are formed, since the two active layers are electrically connected with each other through the contact hole and then the driving transistor and the switching transistors are formed, contact holes are increased, whereby a problem occurs in that the structure of the transistors is complicated.

According to one embodiment of the present invention, the first electrode and the second electrode may be formed on the second active layer 230 including an oxide. That is, the switching transistors may be formed on the second active layer 230 electrically insulated from the first active layer 210. In this instance, the switching transistors having the property of the second active layer 230 having the channel different from that of the first active layer 210 may be formed. Therefore, response speed and voltage-current properties may be more improved than the instance that the switching transistor is used using the first single active layer 230.

Figure 6:
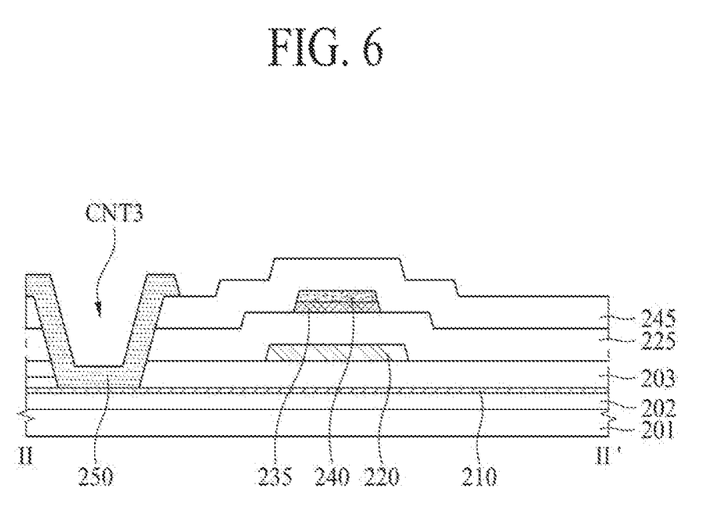
FIG. 6 is a cross-sectional view taken along line II-II' of FIG. 3.

FIG. 6 is a cross-sectional view taken along line II-II' of FIG. 3. As shown in FIG. 6, the electroluminescence display device according to one embodiment of the present invention has a polyimide layer 201, a buffer layer 202, a first gate insulating film 203, a first gate line 220, a first interlayer insulating film 225, a first active layer 210, a second gate insulating film 235, a second gate line 240, a second interlayer insulating film 245, and a source/drain layer 250.

Since the polyimide layer 201, the buffer layer 202, the first active layer 210, the first gate insulating film 203, the first gate line 220, the first interlayer insulating film 225, the second gate insulating film 235, the second gate line 240, and the second interlayer insulating film 245 are the same as those described with reference to FIGS. 3 and 5, their description will be omitted.

The first switching transistor and the second switching transistor are located on the same gate line and thus supplied with the same gate signal. Therefore, in the electroluminescence display device according to one embodiment of the present invention, the first switching transistor and the second switching transistor may be formed using channels formed at different materials and layers, through a dual gate line formed by the first gate line 220 and the second gate line 240. The first switching transistor may be supplied with a gate signal from the first and second gate lines 220 and 240.

The second switching transistor may be supplied with a gate signal from the first gate line 220.

If the electroluminescence display device includes the first gate line 220 only, an interval between the second active layer 230 formed on the second interlayer insulating film 225 and the first gate line 220 serving as a gate electrode of the first switching transistor becomes greater by means of the second interlayer insulating film 225 which is thickly formed. Therefore, there may be a difficulty in supplying the gate signal to the first switching transistor. Also, if the electroluminescence display device includes the second gate line 240 only, an interval between the first active layer 210 formed below the first gate insulating film 203 and the second gate line 240 becomes greater by means of the second interlayer insulating film 225 and the first gate insulating film 203. Therefore, a problem may occur in that the gate signal is not supplied to the second switching transistor.

However, according to the present invention, through a dual gate line of the first gate line 220 and the second gate line 240, the second gate line 240 formed to be close to the second active layer 230 may serve as a main supply source for supplying the gate signal to the first switching transistor and the first gate line 220 may serve as a sub source. Also, the first gate line 220 formed to be close to the first active layer 210 may supply the gate signal to the second switching transistor.

Figure 7:
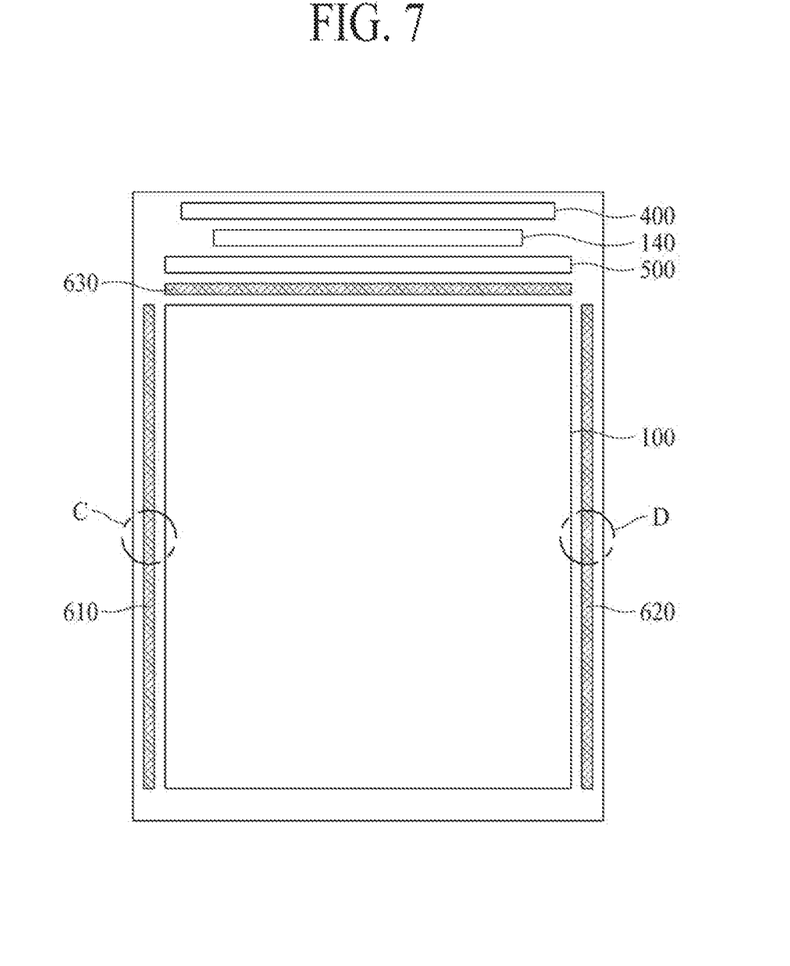
FIG. 7 is a plane view illustrating an electroluminescence display device according to one embodiment of the present invention.

FIG. 7 is a plane view illustrating an electroluminescence display device according to one embodiment of the present invention. The electroluminescence display device according to one embodiment of the present invention includes a driver IC 140, a first pad portion 400, a second pad portion 500, a first GIP circuit portion 610, a second GIP circuit portion 620, and a multiplexer 630.

The driver IC 140 is arranged in the non-display area and drives the display panel. The driver IC 140 according to one embodiment of the present invention may have the functions of the gate driver 110, the data driver 120 and the timing controller 130 in one chip. Therefore, the electroluminescence display device to which the driver IC 140 according to one embodiment of the present invention is applied may widely be used for small sized electronic devices such as a portable terminal and a smart watch.

The first pad portion 400 is arranged at the outmost of the driver IC 140 and receives an external test signal. Also, the first pad portion 400 may serve to output a response signal to the outside of the electroluminescence display device.

The second pad portion 500 is arranged between the driver IC 400 and the display area and supplies signals output from the driver IC 140 to the pixels provided in the display area. Also, the second pad portion 500 outputs sensing data sensed by the display area to the driver IC 140.

The first and second GIP circuit portions 610 and 620 are arranged at the side of the display area. For example, as shown in FIG. 7, the first GIP circuit portion 610 may be arranged at the left side of the display area, and the second GIP circuit portion 620 may be arranged at the right side of the display area. Alternatively, the first GIP circuit portion 610 may be arranged at the right side of the display area, and the second GIP circuit portion 620 may be arranged at the left side of the display area. The first and second GIP circuit portions 610 and 620 are circuit portions that supply scan signals output from the gate driver and are formed in a single body with the display panel and provided in a gate in panel (GIP) mode.

The multiplexer 630 is formed at an edge area above the display area. The multiplexer 630 serves to control output timing of data voltages generated and supplied by the driver IC 140 to correspond to the digital video data to allow the data voltages to be input to the pixels provided on the display panel simultaneously or in accordance with a driving timing which is set.

Also, an antistatic circuit for preventing static electricity (ESD) and power lines for supplying a power source to the display panel are provided at the edge area of the display panel.

Figure 8:
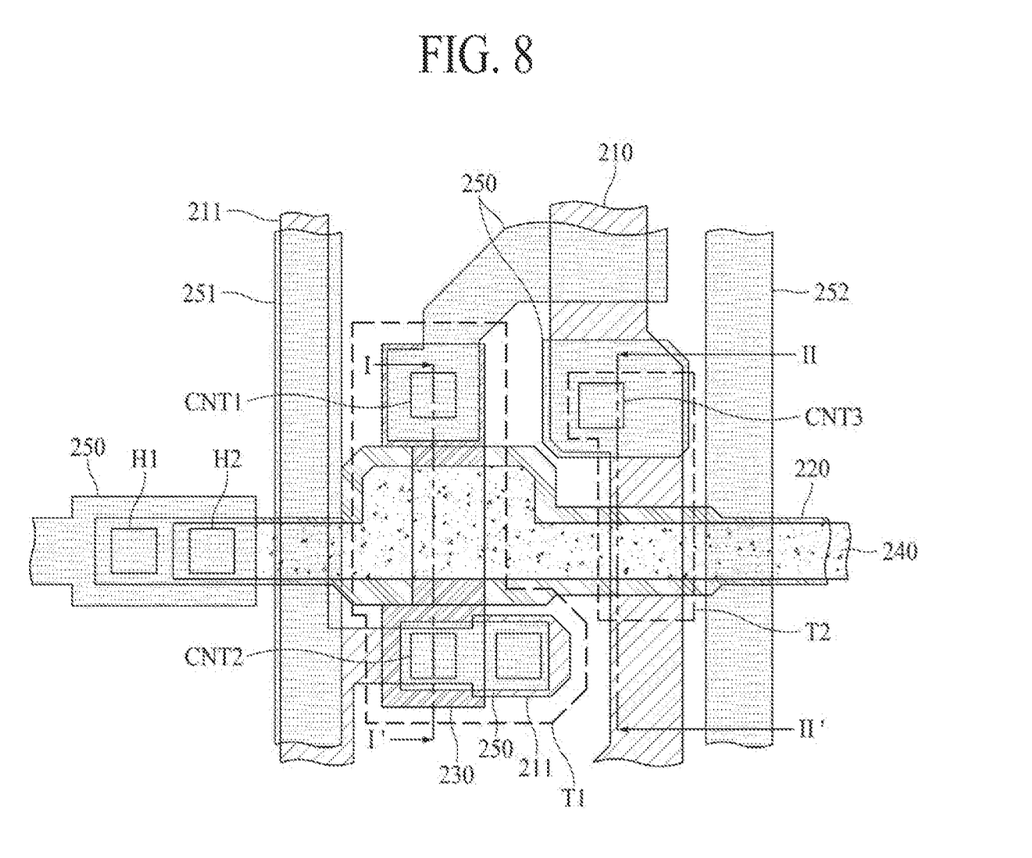
FIG. 8 is a detailed plane view illustrating a portion C of FIG. 7.

FIG. 8 is a detailed plane view illustrating a portion C of FIG. 7. The portion C is an enlarged view of the first and second GIP circuit portions 610 and 620. A portion D may be formed symmetrically with the portion C. Also, a structure of pixels except the contact holes on the gate line is the same as the description made with reference to FIG. 3.

The first gate line 220 is connected with the gate electrode of the second switching transistor of each pixel. The second gate line 240 is connected to the gate electrode of the first switching transistor of each pixel. Also, the gate electrode of the first and second switching transistors of each pixel is connected with the first and second active layers 210 and 230 of each pixel.

Also, since the first and second gate lines 220 and 240 are connected with each other, the same scan signal may be supplied to the gate electrode of the first and second switching transistors at the same time.

In more detail, the source/drain layer 250 is formed on the first and second gate contact holes H1 and H2 formed on the first and second GIP circuit portions 610 and 620. The first gate line 220 is connected with the source/drain layer 250 through the first gate contact hole H1. Also, the second gate line 240 is connected with the source/drain layer 250 through the second gate contact hole H2. Therefore, the first and second gate lines 220 and 240 are connected with each other. Therefore, the first and second gate lines 220 and 240 may supply the same signal. In FIG. 8, the first GIP circuit portion 610 connects the first gate line 220 with the second gate line 240 by using two gate contact holes H1 and H2. However, without limitation to this instance, the number of gate contact holes may be greater than or smaller than two. Also, the gate contact holes for connecting the first gate line 220 with the second gate line 240 maybe provided on the second GIP circuit portion 620. In this instance, since the first and second GIP circuit portions 610 and 620 provided at both edge areas of the display panel may supply the same scan signal, the problem that delay of the scan signal occurs in accordance with the position of the pixel may be minimized. The number of gate contact holes provided at the left side and the number of gate contact holes provided at the right side may be the same as or different from each other in accordance with design of the display device.

In one embodiment of the present invention, the first gate line 220 and the second gate line 240 are connected with each other using the gate contract holes H1 and H2 provided on the first and second GIP circuit portions 610 and 620 arranged at the side of the display area. Therefore, it is easy to design the first gate line 220 and the second gate line 240 to be electrically connected with each other. If the first gate line 220 and the second gate line 240 are electrically connected with each other, a single gate signal may be applied to the first gate line 220 and the second gate line 240, whereby the first and second switching transistors may be operated at the same time.

In the electroluminescence display device according to one embodiment of the present invention, the low temperature polysilicon (LTPS) thin film transistor and the oxide thin film transistor may be used together using the dual gate line structure having two gate lines with respect to the plurality of switching transistors to which the same input signal is input. In other words, the dual line may be used for the plurality of switching transistors located on the same line, whereby the low temperature polysilicon thin film transistor and the oxide thin film transistor may be used together.

According to an aspect of the present disclosure, an electroluminescence display device includes a first active layer; a first gate line arranged on the first active layer to intersect the first active layer; a second active layer forming a channel different from that of the first active layer, arranged on the first gate line; and a second gate line arranged on the second active layer to intersect the second active layer. The first gate line and the second gate line are overlapped with each other, and the first gate line and the second gate line supply the same gate signal.

The first active layer includes a polysilicon channel, and the second active layer includes an oxide channel.

The first gate line and the second gate line have widest widths in an area where the first gate line and the second gate line overlap the second active layer.

The electroluminescence display device further includes an interlayer insulating film covering the second active layer and the second gate line; and a source/drain layer arranged on the second active layer. Also, the source/drain layer is connected with the second active layer through first and second contact holes formed in the interlayer insulating film.

The source/drain layer is additionally arranged on the first active layer, and is connected with the first active layer through a third contact hole formed in a first gate insulating film, another interlayer insulating film and the interlayer insulating film.

The first gate line and the second gate line are connected with gate electrodes of a first switching transistor and a second switching transistor provided in pixels provided in a display area of the electroluminescence display device, and the gate electrodes of the first and second switching transistors are connected with the first and second active layers of each of the pixels.

The first gate line and the second gate line are connected with each other through a first gate contact hole and a second gate contact hole arranged on first and second GIP circuit portions located at both sides of a display area of the electroluminescence display device.

The polysilicon channel is a low temperature polysilicon channel.

According to another aspect of the present disclosure, an electroluminescence display device includes a first active layer; a first gate line arranged on the first active layer to intersect the first active layer; a second active layer forming a channel different from that of the first active layer, arranged on the first gate line; and a second gate line arranged on the second active layer to intersect the second active layer. The second gate line is superimposed on the first gate line, and is separated from the first gate line by an insulating layer.

The first gate line and the second gate line supply the same gate signal.

The first active layer includes a polysilicon channel, and the second active layer includes an oxide channel.

The first gate line and the second gate line have widest widths in an area where the first gate line and the second gate line overlap the second active layer.

The electroluminescence display device further includes a source/drain layer arranged on the second active layer. Also, the insulating film covers the second active layer and the second gate line, and the source/drain layer is connected with the second active layer through first and second contact holes formed in the insulating film.

The source/drain layer is additionally arranged on the first active layer, and is connected with the first active layer through a third contact hole formed in a first gate insulating film, another insulating film and the insulating film.

The first gate line and the second gate line are connected with gate electrodes of a first switching transistor and a second switching transistor provided in pixels provided in a display area of the electroluminescence display device, and the gate electrodes of the first and second switching transistors are connected with the first and second active layers of each of the pixels.

The first gate line and the second gate line are connected with each other through a first gate contact hole and a second gate contact hole arranged on first and second GIP circuit portions located at both sides of a display area of the electroluminescence display device.

According to yet another aspect of the present disclosure, An electroluminescence display device includes a first active layer; a first gate line arranged on the first active layer to intersect the first active layer; a second active layer forming a channel different from that of the first active layer, arranged on the first gate line; and a second gate line arranged on the second active layer to intersect the second active layer. Also, the first gate line and the second gate line supply the same gate signal.

The first active layer includes a polysilicon channel, and the second active layer includes an oxide channel.

The first gate line and the second gate line have widest widths in an area where the first gate line and the second gate line overlap the second active layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electroluminescence display device, comprising:
a first active layer including a poly silicon channel;
a first gate insulating layer covering the first active layer;
a first gate line arranged on the first gate insulating layer to intersect the first active layer;
a first interlayer insulating film covering the first gate line and the first active layer;
a second active layer disposed on the first interlayer insulating film and forming an oxide channel different from the poly silicon channel of the first active layer;
a second gate insulating layer on the second active layer; and
a second gate line arranged on the second gate insulating layer to intersect the second active layer, the first gate line and the second gate line being overlapped with each other, and the first gate line and the second gate line supplying a same gate signal,
wherein the first active layer and the second active layer are not overlapped with each other,
wherein the first gate line and the second gate line are parallel and each have a widest width in a first area where the first gate line and the second gate line overlap the second active layer in a plan view, and
wherein the widest widths of the first gate line and the second gate line in the first area where the first gate line and the second gate line overlap the second active layer are greater than each width of the first gate line and the second gate line in a second area where the first gate line and the second gate line overlap the first active layer in the plan view.

2. The electroluminescence display device of claim 1, further comprising:
a second interlayer insulating film covering the second active layer and the second gate line; and
a source/drain layer arranged on the second active layer, wherein the source/drain layer is connected with the second active layer through first and second contact holes formed in the second interlayer insulating film.

3. The electroluminescence display device of claim 2, wherein the source/drain layer is additionally arranged on the first active layer, and is connected with the first active layer through a third contact hole formed in the first gate insulating layer, the first interlayer insulating film and the second interlayer insulating film of the electroluminescence display device.

4. The electroluminescence display device of claim 1, wherein the first gate line and the second gate line are connected with a respective gate electrode of a first switching transistor and a second switching transistor provided in pixels provided in a display area of the electroluminescence display device, and the gate electrodes of the first switching transistor and the second switching transistor are connected with the first active layer and the second active layer of each of the pixels.

5. The electroluminescence display device of claim 1, wherein the first gate line and the second gate line are connected with each other through a first gate contact hole and a second gate contact hole arranged on first and second gate in panel (GIP) circuit portions each located at opposite sides of a display area of the electroluminescence display device.

6. The electroluminescence display device of claim 1, wherein the polysilicon channel is a low temperature polysilicon (LTPS) channel.

7. An electroluminescence display device, comprising:
a first active layer including a poly silicon channel;
a first gate insulating layer covering the first active layer;
a first gate line arranged on the first gate insulating layer to intersect the first active layer;
a first interlayer insulating film covering the first gate line and the first active layer;
a second active layer disposed on the first interlayer insulating film and forming an oxide channel different from the poly silicon channel of the first active layer;
a second gate insulating layer on the second active layer; and
a second gate line arranged on the second gate insulating layer to intersect the second active layer, the second gate line being superimposed on the first gate line, and being separated from the first gate line by the first gate insulating layer and the second gate insulating layer,
wherein the first active layer and the second active layer are not overlapped with each other,
wherein the first gate line and the second gate line are parallel and each have a widest width in a first area where the first gate line and the second gate line overlap the second active layer in a plan view, and
wherein the widest widths of the first gate line and the second gate line in the first area where the first gate line and the second gate line overlap the second active layer are greater than each width of the first gate line and the second gate line in a second area where the first gate line and the second gate line overlap the first active layer in the plan view.

8. The electroluminescence display device of claim 7, wherein an area of the first gate line is greater than an area of the second gate line.

9. The electroluminescence display device of claim 7, wherein the first gate line and the second gate line supply a same gate signal.

10. The electroluminescence display device of claim 7, further comprising a source/drain layer arranged on the second active layer,
wherein a second interlayer insulating film covers the second active layer and the second gate line, and
wherein the source/drain layer is connected with the second active layer through first and second contact holes formed in the second interlayer insulating film.

11. The electroluminescence display device of claim 10, wherein the source/drain layer is additionally arranged on the first active layer, and is connected with the first active layer through a third contact hole formed in the first gate insulating layer, the first interlayer insulating film and the second interlayer insulating film of the electroluminescence display device.

12. The electroluminescence display device of claim 7, wherein the first gate line and the second gate line are connected with a respective gate electrode of a first switching transistor and a second switching transistor provided in pixels provided in a display area of the electroluminescence display device, and the gate electrodes of the first switching transistor and the second switching transistor are connected with the first active layer and the second active layer of each of the pixels.

13. The electroluminescence display device of claim 7, wherein the first gate line and the second gate line are connected with each other through a first gate contact hole and a second gate contact hole arranged on first and second gate in panel (GIP) circuit portions each located at opposite sides of a display area of the electroluminescence display device.

14. An electroluminescence display device, comprising:
a first active layer including a poly silicon channel;
a first gate insulating layer covering the first active layer;
a first gate line arranged on the first gate insulating layer to intersect the first active layer;
a first interlayer insulating film covering the first gate line and the first active layer;
a second active layer disposed on the first interlayer insulating film and forming an oxide channel different from the poly silicon channel of the first active layer;
a second gate insulating layer on the second active layer; and
a second gate line arranged on the second gate insulating layer to intersect the second active layer, the first gate line and the second gate line supplying a same gate signal,
wherein the first active layer and the second active layer are not overlapped with each other,
wherein the first gate line and the second gate line are parallel and each have a widest width in a first area where the first gate line and the second gate line overlap the second active layer in a plan view, and
wherein the widest widths of the first gate line and the second gate line in the first area where the first gate line and the second gate line overlap the second active layer are greater than each width of the first gate line and the second gate line in a second area where the first gate line and the second gate line overlap the first active layer in the plan view.

\* \* \* \* \*